United States Patent [19]

Kovacs et al.

[11] Patent Number: 5,064,968
[45] Date of Patent: Nov. 12, 1991

[54] DOMED LID FOR INTEGRATED CIRCUIT PACKAGE

[75] Inventors: Alan L. Kovacs, Long Beach; Michael R. Ehlert, Irvine; Helen Congleton, Huntington Beach, all of Calif.

[73] Assignee: Hughes Aircraft Company, Los Angeles, Calif.

[21] Appl. No.: 465,851

[22] Filed: Jan. 16, 1990

[51] Int. Cl.$^5$ ............................................. H01L 23/02
[52] U.S. Cl. ..................................... 174/52.4; 357/74
[58] Field of Search ................... 174/52.1, 52.3, 52.4, 174/65 R, 66, 67; 357/74; 206/816; 150/154

[56] References Cited

U.S. PATENT DOCUMENTS 3,836,697  9/1974  Schultz ................................. 174/252
4,126,758 11/1978  Krumme ............................. 174/52.4
4,717,948  1/1988  Sakai et al. ............................ 357/74

Primary Examiner—Leo P. Picard
Assistant Examiner—Bot L. Ledynh
Attorney, Agent, or Firm—Terje Gudmestad; W. K. Denson-Low

[57] ABSTRACT

An integrated circuit package includes a rectangular base, and a continuous sidewall which extends upwardly from the periphery of the base. Microelectronic circuit components are mounted on the base in a cavity defined within the sidewall. A domed lid includes a resilient central domed portion which arches above the cavity. A peripheral edge portion of the lid extends downwardly into the cavity by a small distance, adjacent to the inner surface of the sidewall. A lip extends outwardly from the edge portion and is sealingly welded at its periphery to the upper surface of the sidewall. The joint between the lip and edge portion is resilient and acts as a hinge, such that when a force or pressure is applied to the domed portion, the edge portion rotates about the hinge into abutment with the inner surface of the sidewall. This transfers a major component of the applied force to the sidewall, and resists deflection of the domed portion into the cavity.

17 Claims, 3 Drawing Sheets

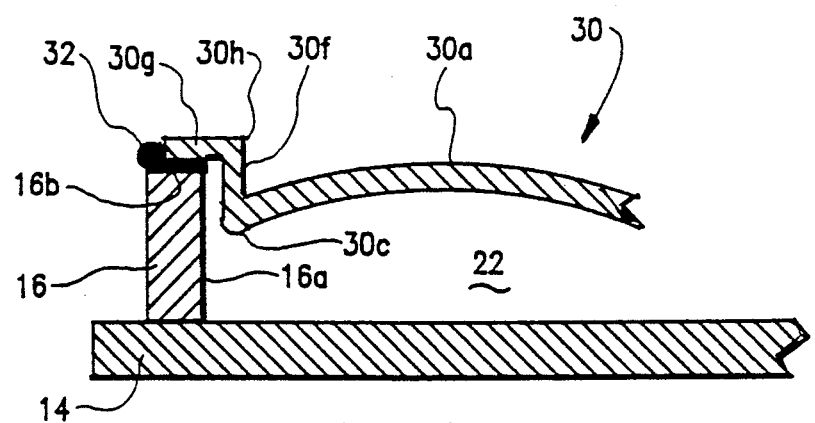
Fig.3.a.
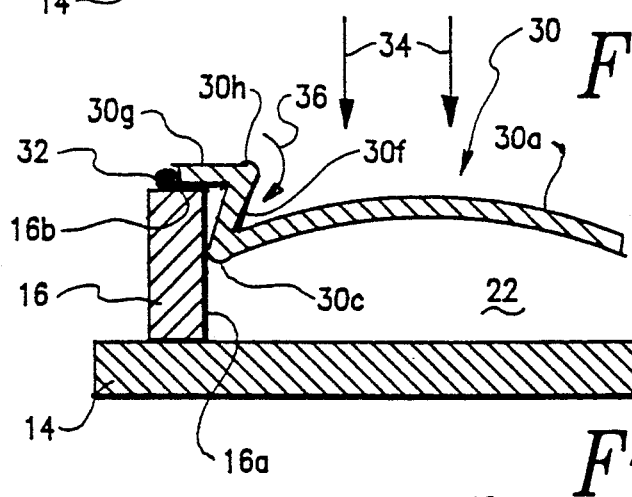
Fig.3.b.
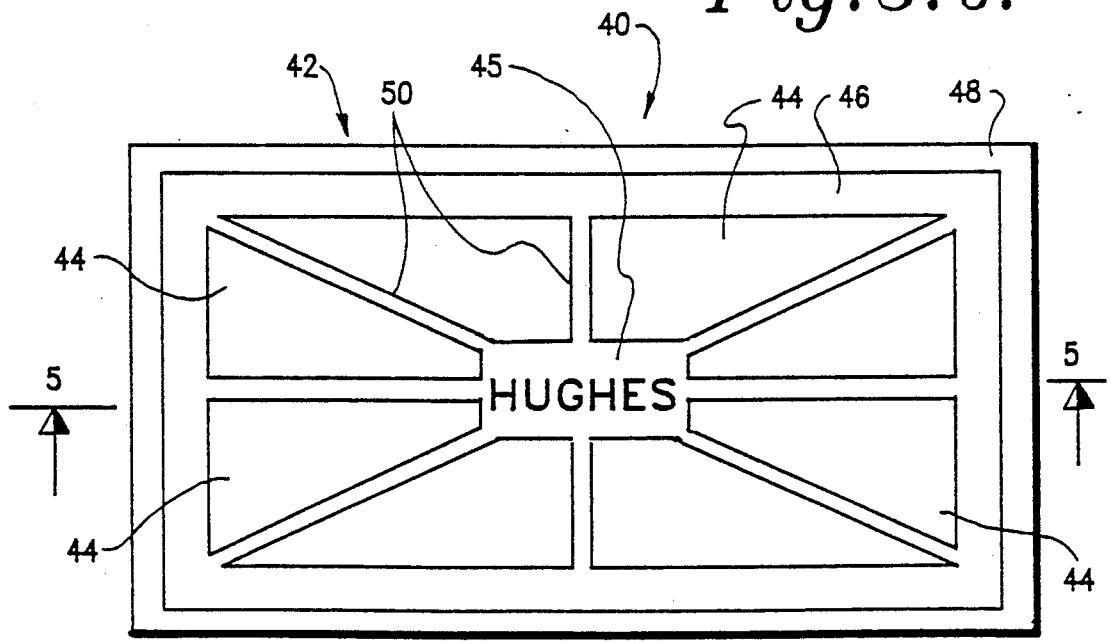
Fig.4.

DOMED LID FOR INTEGRATED CIRCUIT PACKAGE

BACKGROUND OF THE INVENTION

1. Field of the Invention

The present invention generally relates to the art of microelectronic circuit packaging, and more specifically to a domed lid for an integrated circuit package which transfers a major component of an applied force or pressure from the lid into a sidewall of the circuit package, and resists deflection of the lid into the package.

2. Description of the Related Art

Microelectronic circuits, including hybrid microcircuits, may be encapsulated in a hermetically sealed case or package which provides support and protection. Numerous package configurations are known in the art, those relevant to the present invention including a base, and a continuous sidewall upstanding from the periphery of the base. The sidewall may be integral with the base, or formed separately and welded or brazed to the base. A microcircuit board which includes a plurality of integrated electronic components and interconnecting metallizations is mounted on the base within a cavity defined by the sidewall. Pins extend externally from the cavity through the base for connection of the microcircuit board to an apparatus in which the circuit is incorporated.

The packages are hermetically sealed by a cover or lid which spans the sidewall. The material most widely used for the packages and lids is Kovar, an alloy manufactured by the General Electric Company, including 53% iron, 29% nickel, and 18% cobalt. A gold or nickel plating may be applied to prevent corrosion. The lids are welded or soldered at their peripheries to the upper surface of the sidewall, thereby hermetically sealing the cavity in which the microcircuit board is mounted.

Microcircuit package lids known in the art are either simple flat plates, or have a "hat-shaped" configuration. An example of prior art package lids and sealing methods is presented in an article entitled "SOLDER SEALING OF LARGE COMPLEX HYBRID MICROCIRCUITS", by J. Holley, ISHM National Symposium Proceedings (1969), pp. 5-11. A hat-shaped lid includes a flat central area which is raised from the sidewall of the package by an upstanding edge portion to provide a "T-joint" configuration for welding. Alternatively, a lip, which resembles the brim of a hat, may extend outwardly from the upstanding edge portion.

Prior to shipment, an assembled circuit package must be tested to confirm the hermeticity of the seal. During the test, the package is subjected to substantial pressure, which causes the lid to be bent or deflected downwardly into the cavity. This deflection can cause shorting and/or damage to components, and also induces extreme stress in the weld seals which can cause the seals to fail.

This effect is so pronounced in large packages that central support posts have been provided to limit deflection of the lids into the cavities. However, the support posts cause rework problems in de-lidding and circuit repair, since the lids must be de-welded from the support posts for reworking. The circuit boards also become more sensitive to thermally induced stresses since holes must be formed through their substrates for the posts to contact the bases and lids of the packages. Valuable space is lost on the circuit boards since routing cannot take place in the central areas of the boards through which the holes are formed.

SUMMARY OF THE INVENTION

A dome lid for an integrated microcircuit package embodying the present invention provides increased structural rigidity, which is especially essential for large area packages, without resorting to internal support posts to resist deflection of the lids into the cavities. Under pressure loading, the lid transfers the load into the sidewalls of the package. This reduces the stress in the seam seal, and limits the deflection of the lid into the package cavity. This design uses the material of the lid to a greater advantage than previous methods.

The present dome lid increases the reliability of hybrid microcircuit package hermeticity in addition to improving substrate and package rework. Electrical failure in the circuit is reduced since the lid will not deflect into the package cavity and cause shorting or damage to components. Long term temperature cycling of circuits is also facilitated since supports posts previously used to reduce lid deflection are not necessary. The present arrangement allows reductions in the height and weight of hybrid microcircuit packages, and increases the efficiency of the circuit board design by eliminating the holes which were previously required for the support posts. The reduction in size of the package further results in increased stability.

The present domed lid increases circuit rework yields and reduces the requirements for reworking microcircuit packages since many of the causes of reworking are eliminated. This increases the overall reliability of the microcircuit.

An integrated circuit package which achieves the above advantages includes a rectangular base, and a continuous sidewall which extends upwardly from the periphery of the base. Microelectronic circuit components are mounted on the base in a cavity defined within the sidewall. A domed lid includes a resilient central domed portion which arches above the cavity. A peripheral edge portion of the lid extends downwardly into the cavity by a small distance, adjacent to the inner surface of the sidewall. A lip extends outwardly from the edge portion and is sealingly welded at its periphery to the upper surface of the sidewall. The joint between the lip and edge portion is resilient and acts as a hinge, such that when a force or pressure is applied to the domed portion, the edge portion rotates about the hinge into abutment with the inner surface of the sidewall. This transfers a major component of the applied force to the sidewall, and resists deflection of the domed portion into the cavity.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 3a and 3b are fragmentary sectional views illustrating the principle of operation of the invention;

FIG. 4 is a plan view of an alternative domed lid configuration embodying the invention;

DETAILED DESCRIPTION OF THE INVENTION

Figure 1:
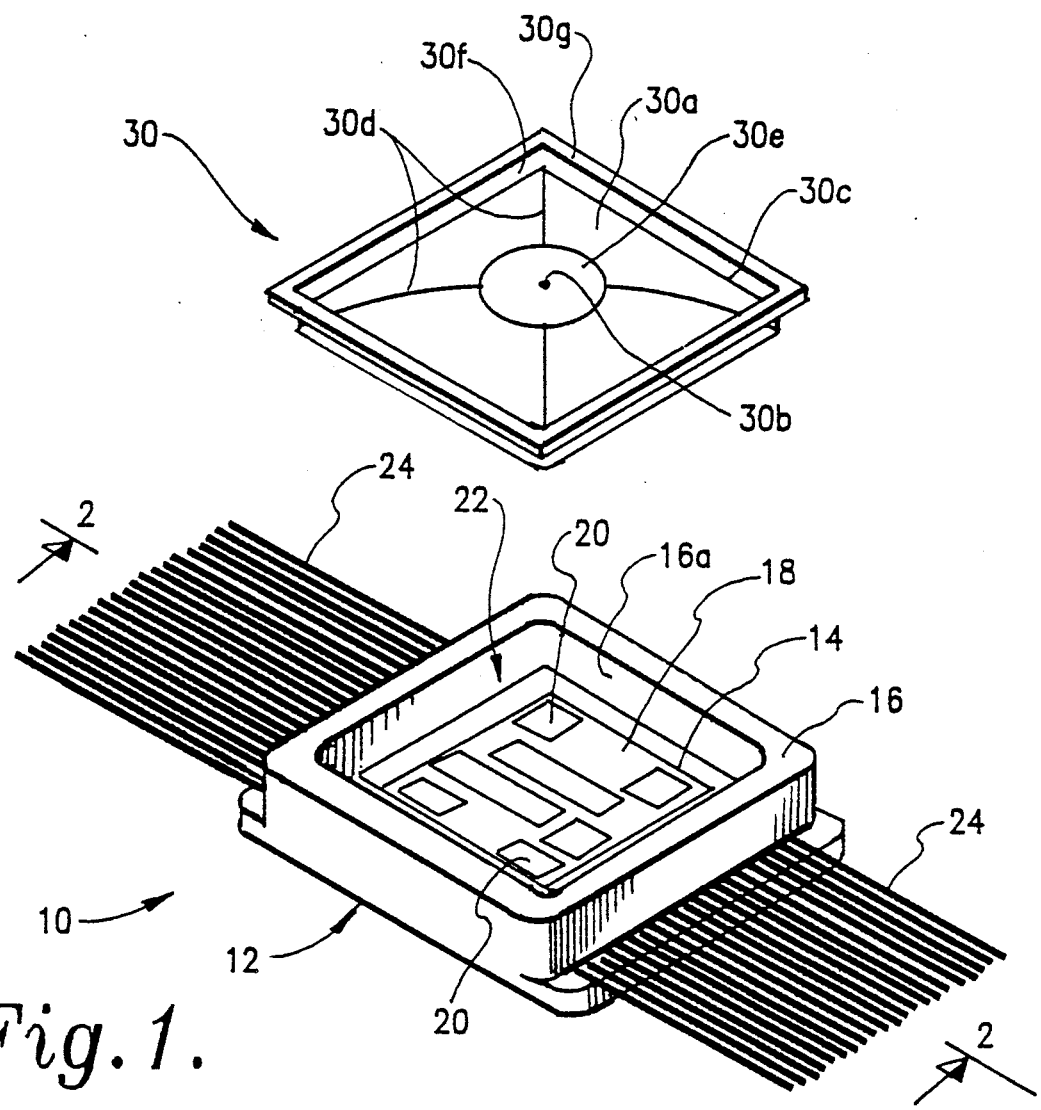
FIG. 1 is a perspective view of a microcircuit package including a domed lid embodying the present invention.
Figure 2:
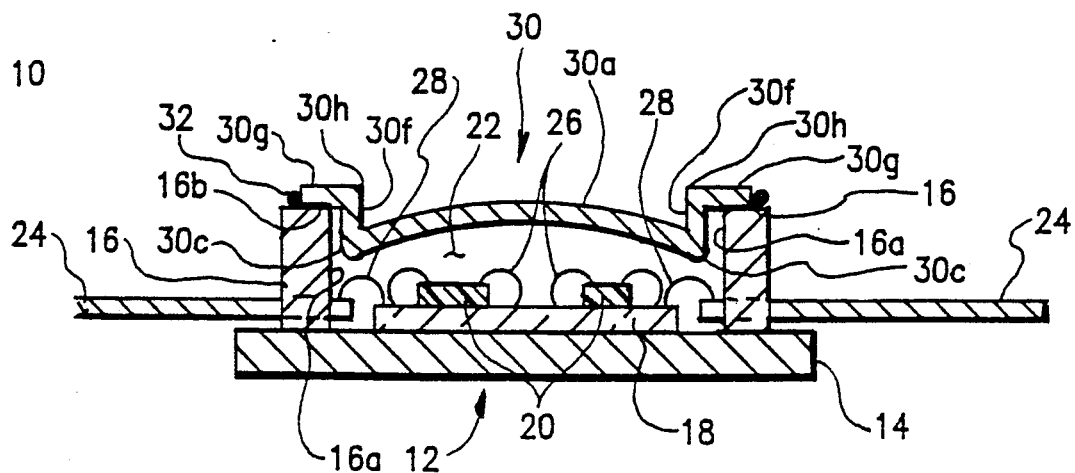
FIG. 2 is a section taken on a line 2—2 of FIG. 1.

Referring now to FIGS. 1 and 2 of the drawing, a microcircuit assembly embodying the present invention is generally designated as 10, and includes a "flatpack" package 12 having a generally rectangular flat base 14 and a continuous upstanding sidewall 16 which extends around the periphery of the base 14. A hybrid microcircuit board 18, having a plurality of integrated circuit components 20 mounted thereon, is attached to the base 14 in a cavity 22 defined within the sidewall 16. A plurality of leads 24 extend through the sidewall 16 into the cavity 22, for interconnection of the circuit board 18 with an external apparatus. Further illustrated in FIG. 2 are wire bonds 26 which connect the components 20 to metallizations (not shown) formed on the circuit board 14, and wire bonds 28 which connect the metallizations to the leads 24.

The present invention is not limited to a flatpack package configuration, and may be applied to any type of package, such as a "plug-in" package, with downwardly extending leads, which has a sidewall upstanding from a base.

The cavity 22 is hermetically sealed by a dome lid 30 in accordance with the present invention. The lid 30 includes a resilient central domed portion 30a which is shaped to arch above the cavity 22. More specifically, the domed portion 30a is symmetrically curved upwardly away from the base 14 such that a center 30b thereof is spaced by a maximum distance from a plane defining a periphery 30c of the domed portion 30a, and the distance from the plane progressively decreases from the center 30b toward the periphery 30c. Where the domed portion 30a has a rectangular shape, creases 30d and a central flat area 30e may be created due to unequal curvatures in the sides of the domed portion 30a.

As best viewed in FIG. 2, the present lid 30 further includes an edge portion 30f which extends around the periphery 30c of the domed portion 30a, disposed inside the cavity 22 and extending adjacent and substantially parallel to an inner surface 16a of the sidewall 16. In a typical hybrid microcircuit package configuration, a predetermined small spacing on the order of 0.001-0.002 inches will be provided between the edge portion 30f and the inner surface 16a. The height of the edge portion 30f may vary within a substantial range, but must be small enough to clear the components 20, and wire bonds 26 and 28 in the cavity 22.

The lid 30 further includes a lip portion 30g which extends outwardly from the edge portion 30f, and engages an upper surface 16b of the sidewall 16. The periphery of the lip portion 30g is fixed by means such as welding or soldering to the upper surface 16b as illustrated at 32, to hermetically seal the cavity 22.

The package 12 and lid 30 are preferably made of Kovar alloy, although the invention is not so limited. The sidewall 16 may be formed integrally with the base 14, or may be formed separately as a side seal made of, for example, nickel, and attached by means such as welding or brazing to the base 14. The domed portion 30a of the lid 30 preferably extends inwardly from the edge portion 30f thereof at an initial or "launch" angle of between approximately 1.5-15 degrees away from the base 14. The initial angle decreases to zero at the center 30b of the lid 30 at a rate which is selected in accordance with the size of the package 12.

Where the lid 30 is made of Kovar alloy, the thickness of the domed portion 30a and edge portion 30f is typically between 0.020-0.030 inch, depending on the size of the package. However, since Kovar alloy in this thickness range is difficult to weld under conditions which will not damage the assembly 10, the thickness of the lip portion 30g is preferably reduced to approximately 0.010 inch. The lid 30 may be formed as a unit to produce the dome shape by drawing, stamping, or the like, and the lip portion 30g subsequently stamped down to the smaller thickness.

The principle of operation of the invention is illustrated in FIGS. 3a and 3b. The normal or unloaded condition of the assembly 10 is illustrated in FIG. 3a, in which the edge portion 30f of the lid 30 is spaced from the inner surface 16a of the sidewall 16, and substantially parallel thereto.

In FIG. 3b, a force or pressure is applied to the lid 30 toward the cavity 22 as indicated by arrows 34. In response, the domed portion 30a resiliently bends or deflects slightly into the cavity 22 such that the curvature thereof is reduced as illustrated. The deflection of the domed portion 30a causes the edge portion 30f to be deflected outwardly into abutting engagement with the inner surface 16a of the sidewall 16. More specifically, a portion 30h of the lid 30 which joins the edge portion 30f to the lip portion 30g acts as a resilient hinge, about which the edge portion 30f rotates clockwise as indicated by an arrow 36 in FIG. 3b. The lid 30 absorbs a certain amount of force before the edge portion 30f abuts against the sidewall 16. After abutment, a major component of any further applied force is transmitted by the domed portion 30a and edge portion 30f to the sidewall 16, and is absorbed thereby rather than resulting in further deflection of the lid 30 into the cavity 22.

In this manner, the load is transferred into the sidewall 16 instead of the seal weld 32, as would occur in a prior art package. Since the lid 30 can no longer deflect, the package becomes a pressure vessel, and the lid 30 must fail in a buckling mode before further deflection can occur. Since the lid is stressed in compression rather than flexure as in the prior art, more efficient use is made of the lid material, enabling height and weight reductions. The present lid 30 further resists deflection by incorporating an increased area moment of inertia, and cold work strengthening during fabrication.

Figure 5:
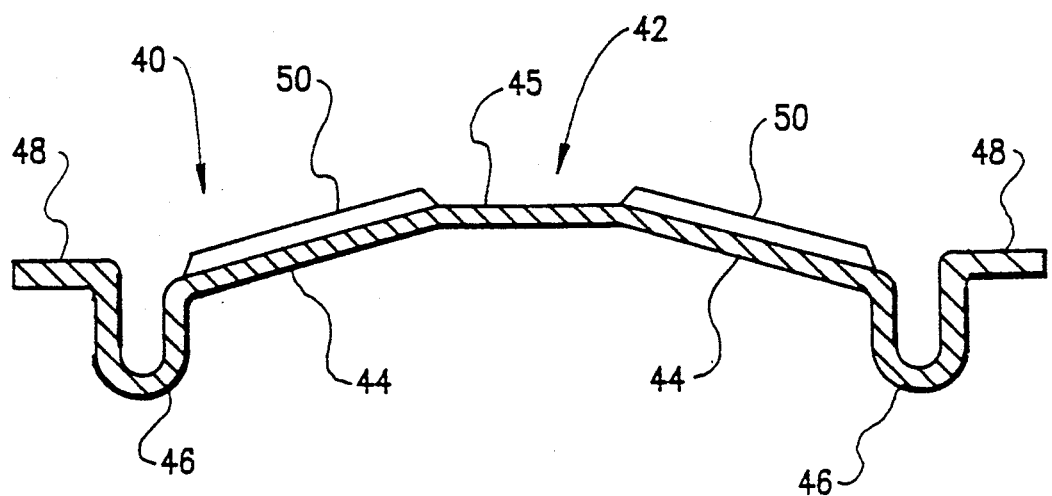
FIG. 5 is a section taken on a line 5—5 of FIG. 4.

Whereas the lid 30 described and illustrated with reference to FIGS. 1 and 2 has a curved domed shape, a domed lid 40 shown in FIGS. 4 and 5 has a domed shape with straight or flat sides. The lid 40 is in the shape of a truncated pyramid, including a domed portion 42 having four side walls 44 and a flat truncated top 45. An identification word, number or the like such as "Hughes", may be advantageously printed or stamped on the top 45. The lid 40 further has an edge portion 46 and a lip portion 48 which are essentially similar to the corresponding elements in FIGS. 1 and 2. Further illustrated are optional drawn or stamped ribs 50 which may connect the corners and/or centers of the sides 44 of the domed portion 42 to reduce the resilience thereof.

Figure 6:
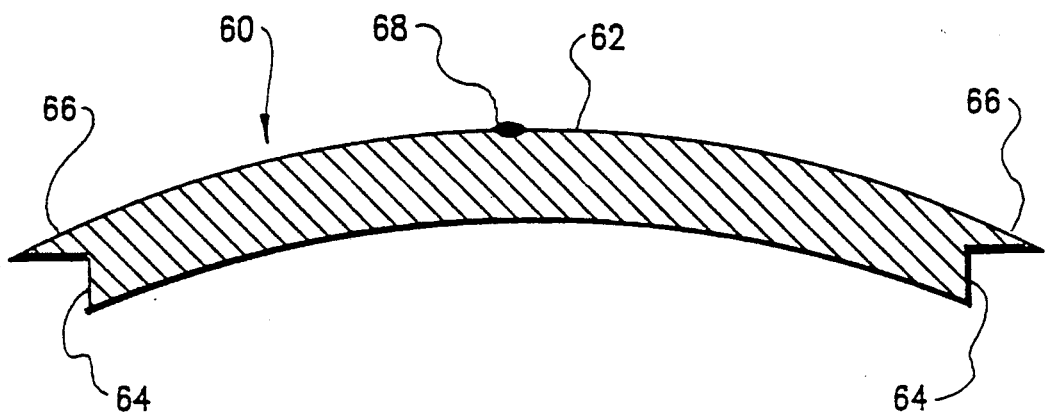
FIGS. 6 and 7 are sectional views illustrating alternative domed lid configurations embodying the present invention.

FIG. 6 illustrates another modified lid 60 in accordance with the present invention. The lid 60 has a substantially continuous domed shape, with a central domed portion 62, edge portion 64, and lip portion 66.

The lid 60 differs from the lids 30 and 40 in that the thickness of the domed portion 62 is substantially equal to the height of the edge portion 64 at the union thereof. The thickness of the domed portion 62 may be constant, or may increase or decrease from the edge portion 64 toward a center 68 thereof.

Figure 7:
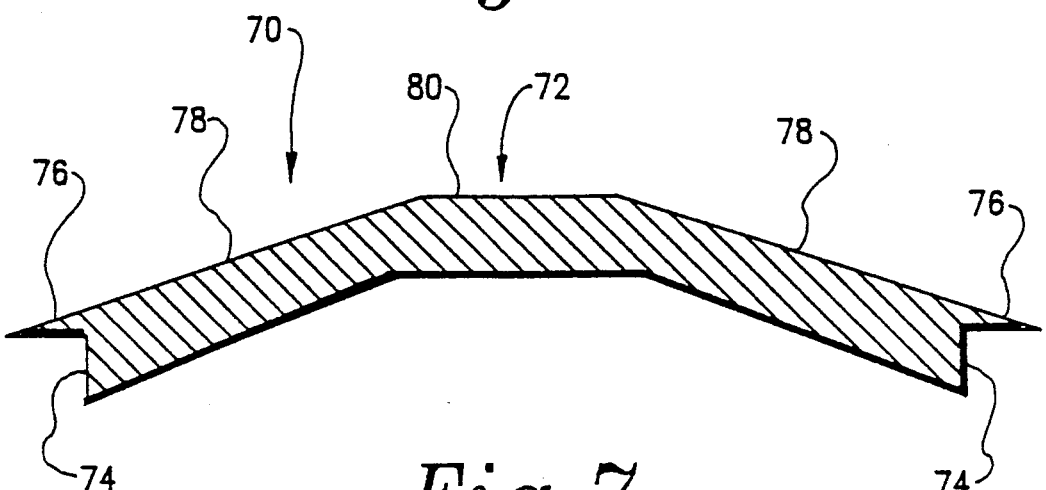

FIG. 7 illustrates another modified lid 70 which is similar to the lid 60 of FIG. 6, and differs therefrom in that the curved domed portion of the lid 60 is replaced by a truncated pyramidal shaped domed portion 72. The lid 70 further includes an edge portion 74 and a lip portion 76. The domed portion 72 has four side walls 78, and a flat truncated top 80, in a configuration similar to the lid 40 shown in FIGS. 4 and 5.

Although the package and lid have been described as being formed from Kovar alloy, which is a metal, the invention is not so limited. The package and lid can be formed of a ceramic, plastic, resin, or any other suitable material and joined together by means such as an adhesive, fusion, or the like. Further, although the lid has been described and illustrated as having the lip portion thereof fixed to the upper surface of the sidewall, it is possible within the scope of the invention to retain the lid to the sidewall using means which will enable the lip to slide inwardly and outwardly along the upper surface of the sidewall. In this case, the edge portion of the lid will be moved laterally toward the sidewall upon deflection of the domed portion in response to an applied force, as opposed to rotating about the hinged portion which joins the edge portion to the lip portion as illustrated in FIGS. 3a and 3b.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A domed lid for an integrated circuit package having a base, and a continuous sidewall upstanding from and defining a cavity in combination with the base, the lid comprising:
   a resilient central domed portion shaped to arch above the cavity;
   an edge portion extending around the periphery of the domed portion, the edge portion being disposed inside the cavity and extending adjacent to an inner surface of the sidewall; and
   a lip portion extending outwardly from the edge portion and engaging with an upper surface of the sidewall;
   the domed portion being constructed to deflect in response to a force applied thereto toward the cavity in such a manner that the edge portion is urged outwardly into abutting engagement with the inner surface of the sidewall.

2. A lid as in claim 1, in which the domed portion is shaped to arch above the cavity in a curved dome shape.

3. A lid as in claim 1, in which the domed portion is shaped to arch above the cavity in a pyramidal shape.

4. A lid as in claim 1, in which the domed portion is shaped to arch above the cavity in a truncated pyramidal shape.

5. A lid as in claim 1, in which the edge portion is spaced inside the inner surface of the sidewall by a predetermined distance.

6. A lid as in claim 1, further comprising means for sealingly fixing the lip portion to the upper surface of the sidewall.

7. A lid as in claim 6, in which the lip portion is thinner than the domed portion and edge portion.

8. A lid as in claim 6, in which a portion of the lid which joins the lip portion to the edge portion is resilient, and constitutes a hinge therebetween.

9. A lid as in claim 1, in which the domed portion extends inwardly from the edge portion at an initial angle of between approximately 1.5–15 degrees away from the base.

10. A lid as in claim 1, in which the sidewall, domed portion, and edge portion have conjugate rectangular shapes.

11. A lid for an integrated circuit package, comprising:
    a resilient central portion;
    an edge portion extending around the periphery of the central portion; and
    a lip portion extending outwardly from the edge portion, a section of the edge portion extending downwardly from the lip portion forming a resilient joint which acts as a hinge therebetween;
    the central portion being formed in a dome shape which arches toward the lip portion.

12. A lid as in claim 11, in which the central portion is shaped to arch in a curved dome shape.

13. A lid as in claim 11, in which the central portion is shaped to arch in a pyramidal shape.

14. A lid as in claim 11, in which the central portion is shaped to arch in a truncated pyramidal shape.

15. A lid as in claim 11, in which the lip portion is thinner than the central portion and edge portion.

16. A lid as in claim 11, in which the central portion extends inwardly from the edge portion at an initial angle of between approximately 1.5–15 degrees away from a plane defining said periphery.

17. A lid as in claim 11, in which the central portion, edge portion, and lip portion have conjugate rectangular shapes.

* * * * *